(12) United States Patent
Andrews

(10) Patent No.: US 8,250,448 B1
(45) Date of Patent: Aug. 21, 2012

(54) METHOD OF AND APPARATUS FOR IMPLEMENTING A DECODER

(75) Inventor: David Andrews, Falkirk (GB)

(73) Assignee: Xilinx, Inc., San Jose, CA (US)

( * ) Notice: Subject to any disclaimer, the term of this patent is extended or adjusted under 35 U.S.C. 154(b) by 1183 days.

(21) Appl. No.: 12/056,193

(22) Filed: Mar. 26, 2008

(51) Int. Cl.
*H03M 13/03* (2006.01)
(52) U.S. Cl. ......................... 714/792; 714/786
(58) Field of Classification Search .................. 714/755, 714/786, 792
See application file for complete search history.

(56) References Cited

U.S. PATENT DOCUMENTS

| | | | |
|---|---|---|---|
| 5,721,745 A * | 2/1998 | Hladik et al. | 714/755 |
| 6,530,059 B1 * | 3/2003 | Crozier et al. | 714/786 |
| 6,594,792 B1 * | 7/2003 | Hladik et al. | 714/755 |
| 6,889,353 B2 * | 5/2005 | Nieminen | 714/786 |
| 7,100,101 B1 | 8/2006 | Hemphill et al. | |
| 7,395,492 B2 * | 7/2008 | Dominique et al. | 714/794 |
| 2002/0007474 A1 * | 1/2002 | Fujita et al. | 714/755 |
| 2004/0025103 A1 * | 2/2004 | Obuchii et al. | 714/755 |
| 2004/0117715 A1 * | 6/2004 | Ha et al. | 714/776 |
| 2004/0153942 A1 * | 8/2004 | Shtutman et al. | 714/755 |
| 2005/0172201 A1 * | 8/2005 | Kutz et al. | 714/755 |
| 2006/0010362 A1 * | 1/2006 | Kwak | 714/755 |
| 2006/0059402 A1 * | 3/2006 | Dominique et al. | 714/755 |
| 2007/0250753 A1 * | 10/2007 | Bresalier et al. | 714/755 |
| 2008/0092010 A1 * | 4/2008 | Orio | 714/755 |
| 2008/0133998 A1 * | 6/2008 | Nimbalker et al. | 714/755 |

OTHER PUBLICATIONS

DS675, Product Specification, "3GPP LTE Turbo Decoder v1.0", Apr. 25, 2008, 31 pages, Xilinx, Inc. 2100 Logic Drive, San Jose, CA 95124.
XMP020, Product Brief, "3GPP LTE Turbo Decoder v1.0", Apr. 25, 2008, 2 pages, Xilinx, Inc. 2100 Logic Drive, San Jose, CA 95124.
3 DSP White Paper, Harrison, James G., "Implementation of a 3GPP Turbo Decoder on a Programmable DSP Core", 3DSP Corporation, Communication Design Conference, San Jose, CA, Oct. 2, 2001, 9 pages.

* cited by examiner

*Primary Examiner* — Yolanda L Wilson
(74) *Attorney, Agent, or Firm* — Gerald Chan

(57) ABSTRACT

Method and apparatus for concatenated and interleaved turbo product code decoding are described. The turbo encoder include a plurality of decoders coupled to receive first portion of data, a processor coupled to receive second portion of the data, and a controller providing a plurality of control signals coupled to the plurality of decoders and the processor. A control signal of the plurality of control signals coupled to the processor when enabled configures the processor to pre-calculate the second portion of the data, where the second portion of the data is trellis termination data.

20 Claims, 6 Drawing Sheets

METHOD OF AND APPARATUS FOR IMPLEMENTING A DECODER

FIELD OF THE INVENTION

One or more aspects of the invention generally related to integrated circuits and, more particularly, to a turbo code decoder implementation in a system.

BACKGROUND

Conventionally, in the design of communications system there is a trade off between bit error rate (BER) and transmission bit rate. Higher bit rates tend to have higher BERs. A well-known limit on capacity of a communications channel is known as the Shannon Limit. In practice, where forward error correction (FEC) is used, the Shannon Limit is a theoretical boundary on channel capacity for a given modulation and code rate, where the code rate is the ratio of data bits to total bits transmitted for some amount of time, such as a second. FEC coding adds redundancy to a message by encoding such a message prior to transmission.

Error correction codes, including one or more used in FEC, classically exist as block codes (Hamming, Bose-Chaudhuri-Hochquenghem (BCH), and Reed-Solomon), convolutional codes (Viterbi), trellis codes, concatenated (Viterbi/Reed-Solomon), turbo convolutional codes (TCCs), and turbo product codes (TPCs). With respect to TPCs, an extended Hamming code (a Hamming code with a parity bit) and parity codes are commonly used to construct product codes.

Others have suggested serial concatenated TCC encoding, then interleaving output from that first TCC encoding followed by TCC encoding again the interleaved output. Others have suggested that such serial concatenated TCC encoding is not bandwidth efficient and exhibits an undesirable error floor phenomenon. However, with respect to TPCs, it should be understood that they are based on block codes and not convolutional codes.

FIG. 1 illustrates an exemplary turbo encoder block diagram including two constituent encoders, e.g., encoder 101 and encoder 102, and an interleaver 103. The first encoder 101 process message blocks coupled to input signal 110. The first encoder 101 provides two outputs coupled to signals 112 and 113 respectively. Signal 112 may provide systematic (S) output data stream, where signal 113 may provide parity (P) output data stream. The second encoder 102 is coupled to receive input from interleaver 103. As shown in FIG. 1, interleaver 103 is coupled to receive the message blocks of input signal 110 in one order and writes such message blocks into an information array in a different order. Interleaver 103 may be a helical interleaver or a pseudo-random interleaver, among other well known interleavers. For purposes of clarity, a helical interleaver 103 is described, though other known interleaving may be used. The second encoder 102 processes the interleaved version of the message blocks provided by interleaver 103. The encoder 102 provides two outputs coupled to signals 117 and 118 respectively. Signal 117 may provide interleaved systematic ($S_i$) output data stream, where signal 118 may provide interleaved parity ($P_i$) output data stream. In general, the $S_i$ output may be discarded, for example to minimize interconnect issues, as it may be regenerated from the S output data stream.

For instance, a decoder coupled to receive outputs from the encoder module 100 may perform both forward error correction (alpha) and backwards error correction (beta) state calculations through the state trellis. The alpha and beta state calculations are generally iterative to improve error correction performance. Also, the error correction performance of a decoder is greatly improved if the decoder has knowledge of both the initial and final states of the encoders. In general, the initial state of the encoder is known, since the encoders are reset before each message block. In contrast, the final state of an encoder is not known by a recipient decoder.

Trellis termination is a technique to provide a known final state at the end of a message block. The trellis termination generally determines additions input bits that returns an encoder to its initial state, e.g., reset state. The additional bits provide additional systematic and parity bits which must be appended to the encoded message, e.g., output of circuit 100. The additional bits are referred to as tail bits or trellis termination bits, and generally, they are appended at the end of the encoded message data stream.

Therefore, an efficient decoder design to decode an encoded message data stream or blocks including tail bits is needed to meet throughput and performance requirements.

SUMMARY OF THE INVENTION

Implementing a decoder to decode an encoded message including tail bits requires more calculations and reduces the decoder throughput and efficiency. One or more aspects in accordance with the present invention provide decoder module, including a plurality of decoders coupled to receive a first portion of data, a processor coupled to receive a second portion of the data, and a controller providing a plurality of control signals coupled to the plurality of decoders and the processor. A control signal of the plurality of control signals coupled to the processor configures the processor to pre-calculate the second portion of the data, where the second portion of the data is trellis termination data.

Another aspect is method of decoding system data, including the steps of providing encoded data packet including trellis termination data, separating the encoded data packet into a plurality of data packets, pre-calculating a first data portion of the plurality of data packets, combining the pre-calculated first data with a second data portion of the plurality of data packets, and decoding the plurality of data packets, where the first data portion is the trellis termination data.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details. In other instances, well known features have not been described in detail, so as not to obscure the invention. For ease of illustration, the same numerical labels may be used in different diagrams to refer to the same items. However, in alternative embodiments the items may be different.

Figure 1:
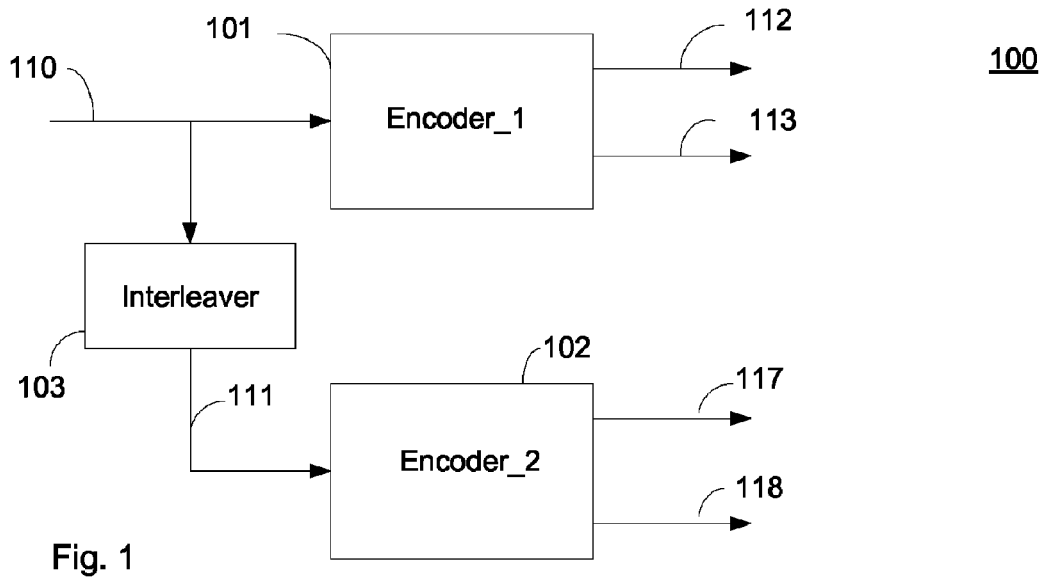
FIG. 1 illustrates a block diagram example of a turbo encoder.

As described above, with reference to FIG. 1, block diagram 100 may represent an encoder that may be used in a turbo encoder module. The encoder 100 may provide systematic (S), parity (P), interleaved systematic ($S_i$), and interleaved parity ($P_i$) data streams. In an example, the encoder 100 may also provide trellis termination bits appended to the encoded message block, e.g., the S and P data streams. In general, the number of tail bits or trellis termination bits appended to the output on an encoded data streams depends on the number of state bits in each constituent encoder. For example, third generation partnership project (3GPP) LTE protocol requires three state bits; therefore, each encoder provides three systematic tail bits and three parity bits. For instance, if two encoders are used, e.g., encoders 101 and 102 of FIG. 1, to implement the 3GPP light protocol a total of 12 bits may be provided.

Figure 2:
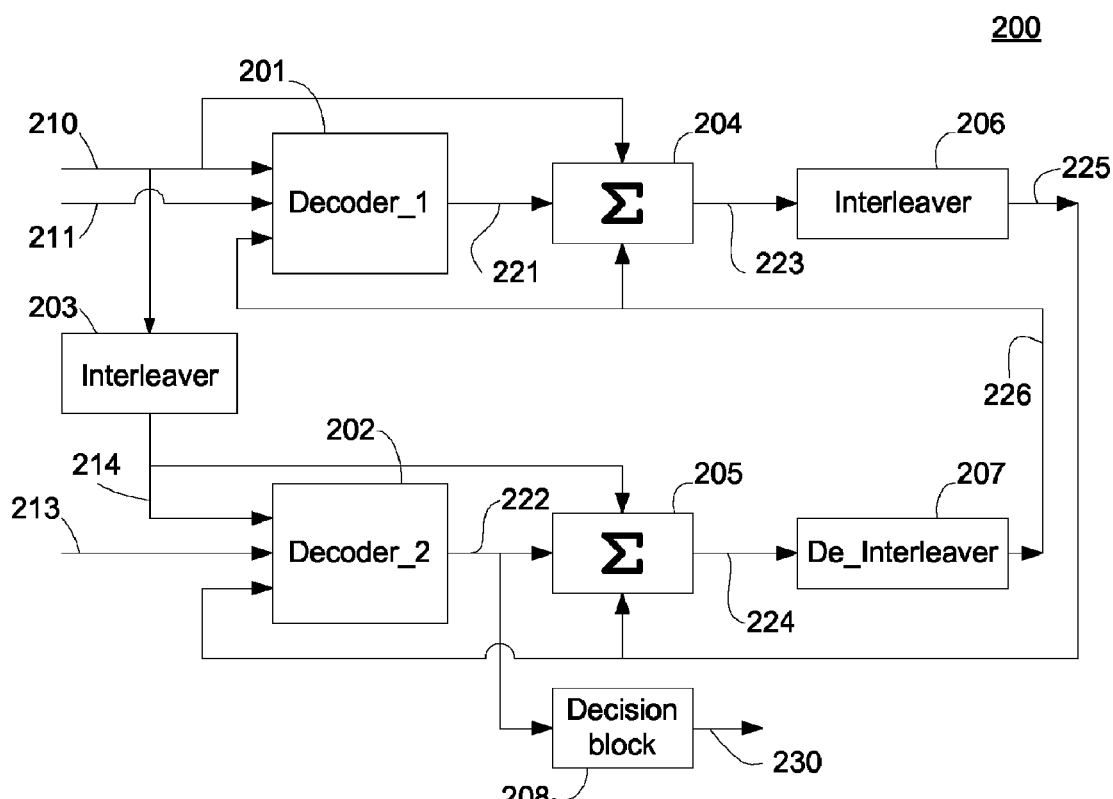
FIG. 2 illustrates a block diagram example of a turbo decoder.

FIG. 2 shows an example of a turbo decoder block diagram 200. In general, turbo decoders operate in an iterative fashion as shown in FIG. 2, with two constituent decoder blocks, i.e., 201 and 202, corresponding to the two constituent encoders 101, and 102 of FIG. 1. As described above, operating the decoders in an iterative fashion may minimize the BER. The first decoder block, i.e., decoder 101, makes an estimate of the probability for each data bit as to whether it is a logic high "1" or logic low "0" by processing the systematic data and the parity data provided by the first constituent encoder, e.g., encoder 101. This estimate is then sent to the second decoder block, e.g., decoder 202, along with interleaved systematic data and the interleaved parity data provided by the second constituent encoder, e.g., encoder 102. The process of two passes thru the decoding algorithm is considered to be one iterative and repeated for a fixed number of iterations, or until some external mechanism determines that no further iterations will improve the bit error rate (BER) for that frame. For example, the number of iteration may be four iterations or greater. The number of iterations are dependant of how low BER is needed for a design protocol. After all iterations are completed, the original data bits may be recovered by way of making a hard decision on the last soft output.

As described above, the turbo decoder 200 may include two constituent decoders 201 and 202. Decoder 201 may be coupled to receive non-interleaved data streams provided by signals 210 and 211, where decoder 202 may be coupled to receive interleaved data streams provided by signals 213 and 214. FIG. 2 shows an example of interleaved systematic data stream provided by interleaver 203, where interleaver 203 may be coupled to receive systematic data stream from signal 210 and provide an interleaved systematic data stream coupled to signal 214. In general, a turbo encoder, e.g., encoder 100, may provide three signals to a turbo decoder, e.g., decoder 200, where the three signals are systematic data stream, parity data stream, and interleaved parity data stream.

The decoder 200 is coupled to receive intrinsic information, e.g., systematic and parity data streams from an encoder, and extrinsic information, e.g., data streams obtained from constituent decoders 201 and 202. For instance, decoders 201 and 202 may also be coupled respectively to a previous data stream of de-interleaved and interleaved data. For example, decoder 201 may be coupled to a previous de-interleaved data stream coupled to signal 226, where decoder 202 may be coupled to a previous interleaved data stream coupled to signal 225. Signals 225 and 226 may also be subtracted from values provided by decoders 202 and 201 respectively. Data processor blocks 204 and 205 may perform operations, e.g., additions and/or subtractions, to data stream provided by decoder 201, decoder 202, interleaver 206, and de_interleaver 207. Data processor blocks 204 and 205 may provide processed extrinsic data streams coupled to interleaver 206 and de_interleaver 207 respectively via signals 223 and 224. The processed extrinsic data streams may represent additional knowledge or information from the current state of constituent decode. As shown in FIG. 2, signals 223 and 224 are respectively interleaved and de_interleaved to match input requirements of the next constituent decode cycle or iteration.

In an example, when a message including K bits and having no trellis termination bits is applied to a decoder, e.g., decoder 200, each constituent decoder may operate on K element vectors. The K element vectors may include, for example, systematic, parity, extrinsic, and output. However, when trellis termination bits are introduced, each constituent decoder operates on K+t element vectors, where t is the number of trellis termination bits added to each systematic and parity vector. For example, in 3GPP LTE protocol three bits are added for each constituent encoded data stream. Therefore, decoding data streams including tail bits may require additional processing, where the additional processing may impact performance and throughput of the decoder. Additionally, the trellis termination bits appended to the interleaved and the non-interleaved data streams may not be related. For instance, the systematic bits required to return encoder 101 and encoder 102 of FIG. 1 to initial states are not correlated. For example, the additional calculations or processing of the extrinsic information relative to trellis termination bits generated by decoders 201 are not valuable or relevant to decoder 202. Therefore, the BER improvements with the additional calculations may not yield additional benefit.

Figure 3A:
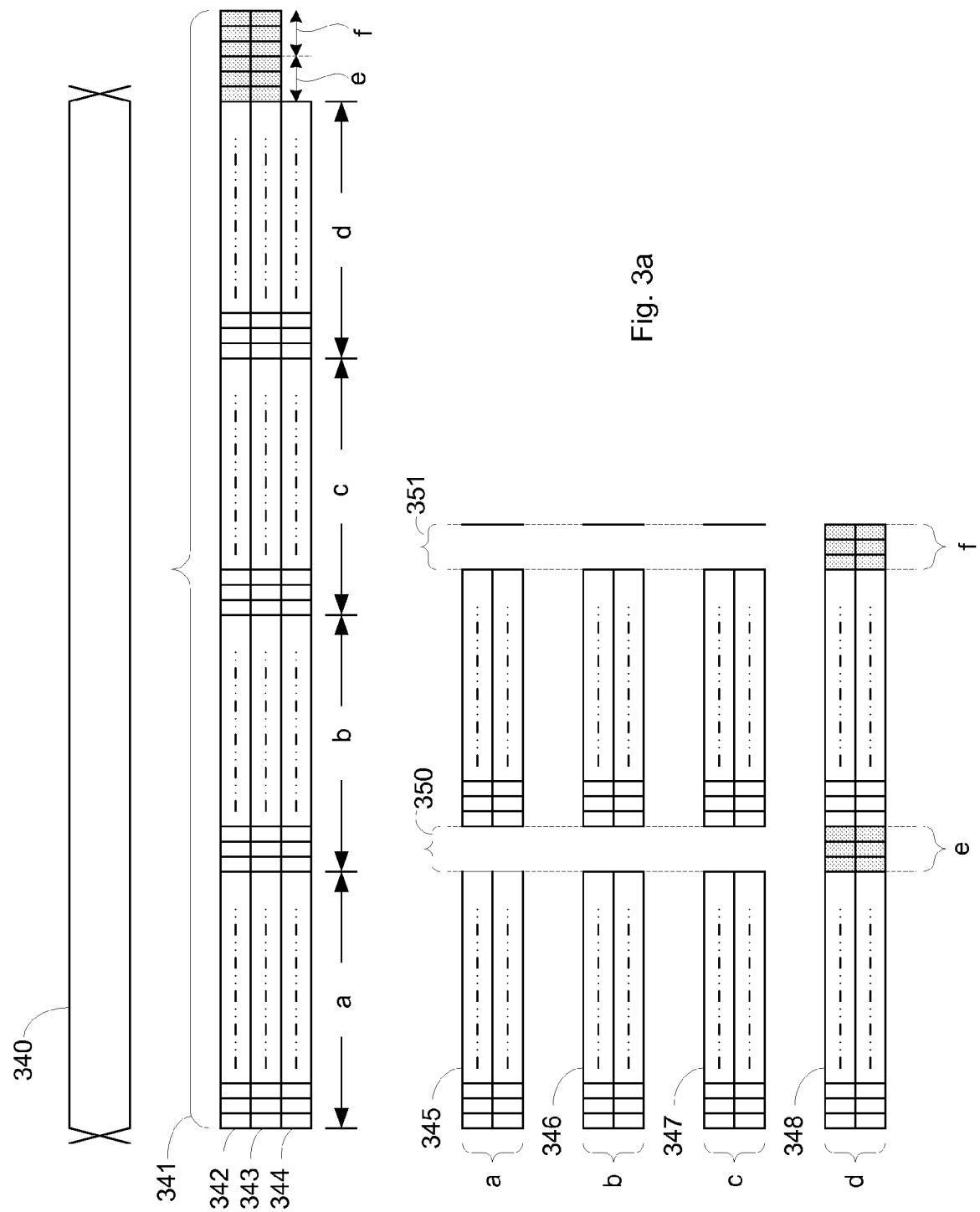
FIG. 3a illustrates an example of an encoded message block and a segmented code blocks of the encoded message block.

The 3GPP LTE code protocol supports parallel decoding by way of utilizing contention free interleaver. Each constituent decode may be split or segmented and distributed to a number of parallel decode engines, thereby greatly increasing decoder throughput. For instance, FIG. 3a illustrates an encoded message block 341 that has been split or segmented into four data streams, e.g., signals 345-348. The segmented signals may be received by, for example, a parallel decoder module including four decoder engines. The example shown in FIG. 3a may take advantage of the contention free interleaver protocol by treating the tail bits separately. For instance, including the tail bits with a segmented code block of the segmented code blocks, e.g., signals 345-348. In general, the tail bits may be included with the last code block, but other implementations of decoder designs may include the tail bits with different segmented code block. In the example shown of FIG. 3a, the last segmented code block 348 includes the tail bits; therefore, a decoder engine coupled to process signal 348 may process the tail bits. The duration it takes a decoder to process signal 348 is longer than the duration other decoders processing signals 345-347. Usually the other decoder processing signals 345-347 stay idle until the decoder processing signal 348 is done. The idle time experienced by the other decoders reduces a parallel decoder module throughput. Also, varying idle times may complicate control signals provided for the parallel decoder module as will be described in more details below.

As stated above with respect to decoding with tail bits, the extrinsic information for the tail bits needs be cleared to prevent misleading information being used in the next constituent decoder. For example, the clearing of the tail bits may affect the max log-MAP algorithm. In general, the max log-MAP algorithm is a type of trellis decoding algorithm derived from the MAP algorithm. The max log-MAP algorithm differs from the MAP algorithm by operating in the log domain. The decoder module according to an embodiment of the present invention may also be applicable to other MAP derived algorithms, e.g., max* log-MAP, and max-scale log-MAP. For the max log-MAP algorithm, the forward (alpha) and reverse (beta) state metrics are calculated iteratively as:

$$a0[n+1]=\max(a0[n]-g3[n],a1[n]+g3[n])$$

$$a1[n+1]=\max(a3[n]-g2[n],a2[n]+g2[n])$$

$$a2[n+1]=\max(a4[n]-g2[n],a5[n]+g2[n])$$

$$a3[n+1]=\max(a7[n]-g3[n],a6[n]+g3[n])$$

$$a4[n+1]=\max(a1[n]-g3[n],a0[n]+g3[n])$$

$$a5[n+1]=\max(a2[n]-g2[n],a3[n]+g2[n])$$

$$a6[n+1]=\max(a5[n]-g2[n],a4[n]+g2[n])$$

$$a7[n+1]=\max(a6[n]-g3[n],a7[n]+g3[n])$$

$$b0[n-1]=\max(b0[n]-g3[n],b4[n]+g3[n])$$

$$b1[n-1]=\max(b4[n]-g3[n],b0[n]+g3[n])$$

$$b2[n-1]=\max(b5[n]-g2[n],b1[n]+g2[n])$$

$$b3[n-1]=\max(b1[n]-g2[n],b5[n]+g2[n])$$

$$b4[n-1]=\max(b2[n]-g2[n],b6[n]+g2[n])$$

$$b5[n-1]=\max(b6[n]-g2[n],b2[n]+g2[n])$$

$$b6[n-1]=\max(b7[n]-g3[n],b3[n]+g3[n])$$

$$b7[n-1]=\max(b3[n]-g3[n],b7[n]+g3[n])$$

where the branch metrics (gamma) are:

$$g2[n]=+(sys[n]+ext[n])-par[n]$$

$$g3[n]=+(sys[n]+ext[n])+par[n]$$

Additionally, the initial and final states of the constituent encoders are known to be 0, therefore, we can initialize alpha and beta as:

$$a0[0]=b0[k+t-1]=0$$

$$a1[0]=b1[k+t-1]=-M$$

$$a2[0]=b2[k+t-1]=-M$$

$$a3[0]=b3[k+t-1]=-M$$

$$a4[0]=b4[k+t-1]=-M$$

$$a5[0]=b5[k+t-1]=-M$$

$$a6[0]=b6[k+t-1]=-M$$

$$a7[0]=b7[k+t-1]=-M$$

where k is the block size and t is the number of tail bits. The constant −M represents the most negative number which state metrics can take, e.g., if state metrics are represented as 6 bit signed quantities, −M would be −32. The state metrics represent probabilities of being in particular states, i.e., the most likely state is represented by the largest value. Therefore, these initializations values represent very high probabilities of being in state 0. Furthermore, the output of the constituent decoder is a function of alpha, beta, and gamma:

$$out[n]=f(a0[n] \ldots a7[n],b0[n] \ldots b7[n],g2[n] \ldots g3[n])$$

For instance, outputs of the constituent decoder, e.g., signals 221 and 222 of FIG. 2, may not require the tail bits. The tail bits may be used to calculate the new extrinsic which would be immediately cleared. Consequentially alpha values are also no longer required, but corresponding beta and gamma values are still needed, as these are used in the iterative generation. Additionally, as extrinsic information ext [k] through ext[k+t−1] are now zero, the gamma calculations for the tail bits can be simplified:

$$g2[n]=+(S[n]+ext[n])-P[n]=+S[n]-P[n]$$

$$g3[n]=+(S[n]+ext[n])+P[n]=+S[n]+P[n]$$

The gamma equation above shows that the beta values for the tail bits (b0[k+t−1] . . . b7[k+t−1] down to b0[k−1] . . . b7[k−1]) now depend solely on the received systematic (S) and parity (P) information, and they do not change from iteration to iteration. Instead of repeatedly calculating these values, they may be calculated twice, once for each decoder, e.g., once for decoder 201 and once for decoder 202, and may be retained for reuse in subsequent calculation of the remaining iterations. Therefore, it becomes possible to pre-calculate b0[k−1] . . . b7[k−1] before decoding segmented code blocks. In a parallel decoder this may completely eliminate idle time while tail bits are being calculated; therefore, ensuring that none of the decoder engines are idling or waiting for trellis termination bits calculations to be completed. Additional advantages of pre-calculating trellis termination bits may include simplified controls to the decoder module including implemented to perform parallel decoding.

FIG. 3a illustrates an example of splitting an encoded message block. Signal 341 may be an encoded message block provided by a turbo encoder, e.g., circuit 100 of FIG. 1. For instance, signal 341 may include several segments appended to one another, for example, segments a, b, c, d, e, and f. Segments a, b, c, and d may include systematic, parity, and interleaved parity data streams provided by a parallel encode module, not shown for simplicity. In an example, the systematic data stream may be represented by section 342, the parity data stream may be represented by section 343, and the interleaved parity data stream may be represented by section 344 of signal 341. Segments "e" and "f" may be trellis termination bits or tail bits of the encoded module. For instance, a 3GPP LTE protocol may require three state bits for each encoder, three bits for systematic tail bits and three bits for parity tail bits. For example, if four encoders are used, then segments "e" and "f" may include 12 trellis termination bits.

Signals 345-348 may represent output of a splitter of a decoder module coupled to receive segments "a-f" of signal 341. In general, a splitter may be used to divide up a received data stream into a plurality of segments according to a design protocol. In some instances, the splitter may provide segments having the same number of bits in each segment. In other instances, the segments may have different number of bits. In the example shown in FIG. 3a, signals 345-347 may have the same number of bits, while signal 348 may include additional bits, i.e., trellis termination bits "e" and "f". Other implementations of a splitter are possible and well known to persons skilled in the art. For example, in splitter 301 of FIG. 3b the encoded data stream (signal 341) may be separated into five signals as will be described in more details below.

Figure 3B:
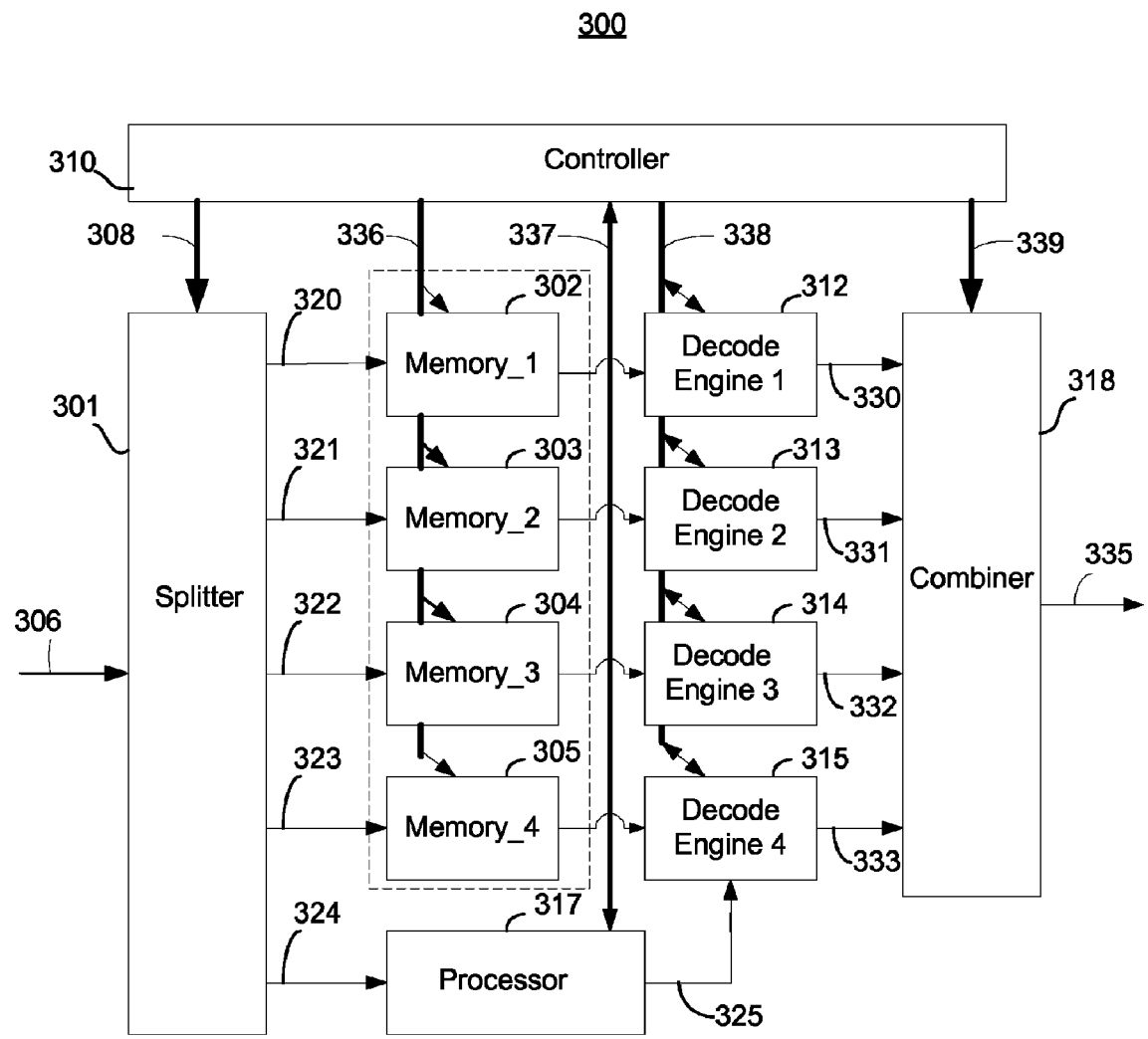
FIG. 3b illustrates a decoder block diagram according to an embodiment of the present invention.

FIG. 3b illustrates a block diagram of a parallel decoder according to an embodiment of the present invention. For example, the decoder module 300 may be a turbo decoder including four decoder engines, e.g., 312-315, and a processor or a pre-calculator 317. For instance, the turbo decoder module 300 may be coupled to receive an encoded message data stream (encoded packet) via signal 306 and provide a decoded message data stream (decoded packet) via signal 335. Other variations of the decoder module 300 implementation are possible which may include different number of decoder engines, for example, eight decoder engines. In the example shown in FIG. 3b, the turbo decoder module may also include a splitter 301, a plurality of memory blocks 302-205, a controller 310, and a combiner 318. For example, the splitter 301 may process an encoded packet coupled to signal 306 to a plurality of data segments representing information of the encoded packet. The splitter 301 may coupled to a memory module, e.g., memories 302-305. In an example, the splitter module 301 and the memories 302-305 may be merged together. The combiner 318 may convert a plurality of decoded data provided by decoders 312-315 to a decoded data stream or decoded packet coupled to signal 335. Signal 335 may represent decoded data outputs coupled to signals 330-333. Implementation of the splitter 301 and the combiner 318 modules are known to persons skilled in the art.

The turbo decoder module 300 may have performance advantages over other decoder implementations performing similar decoding scheme. At least one performance advantage may be constant throughput regardless of the input block size, as will be described in more details below with reference to Table_1. The performance advantage may be achieved by incorporating the pre-calculator 317 for processing tail bits. An example of the pre-calculator 317 may include processing trellis termination data while the decoder engines, e.g., decoder 312-315, are busy processing previous segmented code blocks or data. As shown in FIG. 3b, the turbo decoder module may include memory circuits 302-305 that may be used to store segmented code blocks while the pre-calculator is processing trellis termination data.

The memory circuits 302-305 may be coupled to receive control signal 336 provided by the controller 310. The control signal 336 may control read and write operations of the memory circuits 302-305. In another example, the controller 310 may be coupled to the pre-calculator 317 via signal 337. The controller 310 and the pre-calculator 317 may communicate with each other, for example, the pre-calculator may assert signal 337 indicating that the calculations of the trellis termination data is done. The controller 310 may provide a timing sequence coupled to control signals, e.g., 308, 336, 338, and 339, responsive to the signal provided from the pre-calculator 317 (e.g., signal 337). For instance the controller 310 may configure the memory circuits 302-305 to provide a set of data to the decoder engines 312-315.

In an example of the present invention, the splitter 301 may provide a plurality of segmented data responsive to a data packet coupled to its input, where one of the segmented data is the trellis termination data. The trellis termination data may be coupled the pre-calculator 317 via signal 324. The other segmented data 320-323 of the splitter 301 may be coupled to the decoders 312-315 respectively. In general, the number of bits coupled to each of the signals 320-323 is greater than the number of trellis termination bits coupled to signal 324. Therefore, performance of the pre-calculator, e.g., processor 317, is not overly critical and it may possible to serialize the pre-calculation operation, as will be discussed below.

As described above, the controller 310 may provide timing signals coupled to the pre-calculator 317 to schedule processing of the termination bits while decoder engines 312-315 are processing previous code blocks. The controller 310 may also provide timing signals to the splitter 301, the decoder engines 312-315, and the combiner 318. The controller may also receive signals from the various blocks described above. The signals from the various blocks coupled to the controller 310 may indicate progress or status of the calculations or data processing at each block.

For instance, the memory circuits 302-305 may be viewed as a pipeline or a FIFO (first in first out) memory having the capability to store segments of an encoded message data. The memory circuits 302-305 may be coupled to receive segmented code blocks from the splitter 301 and provide the segmented data to the corresponding decoder engines 312-315. The transaction between the memory circuits 302-305 may be performed in accordance with control signals provided by the controller 310. The memory circuits 302-305, for example, may store data segments while previous data segments are being decoded by the decoder engines 312-315. Various types of memories or registers may be utilized to implement memory circuits 302-305. An example of memory circuits that may be used are static random access memory (SRAM) circuits, or FIFO memory circuits. Also, sizes of the memory circuits may vary in accordance with a design protocol. For example, decoder 300 may use memory circuits capable of storing several segmented message blocks.

The decoder engines 312-315 may be similar, e.g., one decoder design instantiated four times. The decoder engines 312-315 may be coupled to process segmented memory blocks in parallel. The decoder engines 312-314 may process data provided by memory circuits 302-304, while decoder engine 315 may process data provided by memory circuit 305 and data coupled to the output of the pre-calculator 317, e.g., signal 325. In general, a decoder's main function is to reverse the encoding process and to provide the original information. For instance, the parity data stream and trellis termination bits of the encoded data stream may include information for aiding the decoder in providing system level information concerning the validity of the encoded data stream transmitted. The processor or pre-calculator 317 may enable the decoder module 300 to improve the throughput independent of a block size, e.g., number of bits in a encoder message data stream. Table_1, illustrates estimated decoder throughput using full tail bit calculations and using pre-calculations of tail bits. For example, the data provided in Table_1 is based on 400 MHz operation and eight decode iterations.

TABLE_1

| Number of decoder engines | Block Size (bits) | Throughput with tail bits (Mbits/s) | Throughput with pre-calculation (Mbits/s) |
| --- | --- | --- | --- |
| 4 | 256 | 95.52 | 100.00 |
|   | 512 | 97.71 | 100.00 |
|   | 1024 | 98.84 | 100.00 |
|   | 2048 | 99.42 | 100.00 |
|   | 4096 | 99.71 | 100.00 |
| 8 | 256 | 182.86 | 200.00 |
|   | 512 | 191.04 | 200.00 |
|   | 1024 | 195.42 | 200.00 |
|   | 2048 | 197.68 | 200.00 |
|   | 4096 | 198.83 | 200.00 |

Table_1, shows columns including number of decoder engines column, block size, throughput with full tail bits calculations, and throughput with pre-calculations of tail bits. For instance, the turbo decoder architecture described in FIG. 3 includes four decoder engines, where the maximum throughput is 100 Mbits/s. As shown in Table_1, the performance of the turbo decoder according to an embodiment of the present invention is constant regardless of the block size. Also, the turbo decoder module of FIG. 3 has a better percentage performance when a smaller block sizes are used. The enhanced performance with smaller block sizes are due to the ratio of the number of code block bits to number of tails bits.

In general, a turbo encoder design may provide a fixed number of tail bits. Also, the turbo encoder design may only need few bits to provide the state of the encoder, e.g., only 3 tail bits per encoder is needed to implement a turbo encoder design using the 3GPP LTE protocol. Therefore, a turbo decoder not including a pre-calculator (e.g., processor for pre-calculating the tail bits) coupled to decode an encoded packet provided by the turbo encoder described above may use up additional time to process the tail bits. The additional time used up to evaluate the tail bits may be proportional to the total time needed to decode an encoded packet, e.g., a block size described in Table_1. For instance, the percentage of time used up to evaluate the tail bits for smaller block sizes may be greater than the percentage of time used up to evaluate the tail bits of a larger block sizes, as shown with reference to Table_1.

Figure 4:
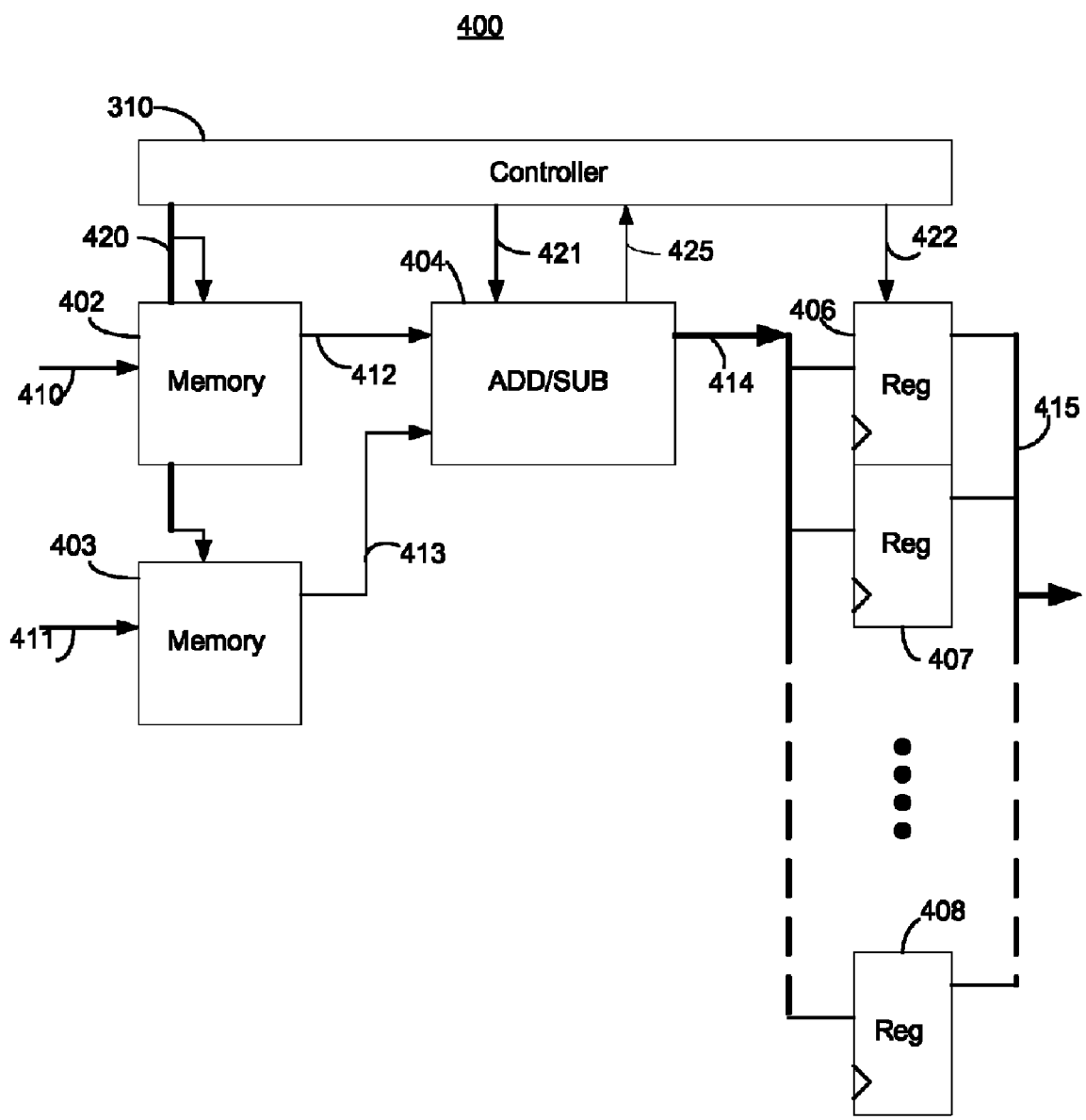
FIG. 4 illustrates a pre-calculation engine block diagram according to an embodiment of the present invention.

FIG. 4 illustrates a block diagram of a pre-calculation engine according to an embodiment of the present invention. Investigation of tail bits calculations indicated that the pre-calculation engine or processor may be reduced to a number of addition and subtraction operations. The simplified pre-calculation technique, for example, produces identical error correction performance to existing designs of turbo encoders that do not include pre-calculation of trellis data. For example, the block diagram shown of FIG. 4 may represent a processor for pre-calculating trellis data according to an embodiment of the present invention. Circuit 400 may employ the simplified pre-calculation technique to process the trellis data.

Pre-calculator engine 400, for example, may include memory circuits 402-403, an adder module 404, and a register module including a plurality of registers 406-408. The controller 310 may provide a plurality of signals, e.g., 420-422, to the pre-calculator engine 400. The timing of one or more of the signals 420-422 may permit the pre-calculation engine to commence calculations or processing of the trellis termination bits. As described above, the processing of the trellis termination bits may coincide with the decoding of a previous segmented code blocks. Signals 410 and 411 may be systematic and parity tail bit of constituent encoders. The pre-calculator engine 400 may process signals 410 and 411 in accordance with the simplified trellis termination bits calculation equations.

The adder 404, for example, may receive control signal 421 from the controller 310 and it may provide a calculation complete signal 425. For instance, if signal 425 is asserted, it may indicate that the calculations of the trellis termination bits are complete. The controller 310 may provide one or more signals to a turbo decoder module, e.g., module 300, based on signal 425. The one or more signals may control various calculation activities and/or provide a signal to a system utilizing such decoder module. For example, controller 310 may assert signal 422 based on receiving calculation complete from the adder 404, e.g., signal 425 is asserted. Other examples of timing signals of control circuit 310 may include signals starting a timing circuit to schedule future decoding events, not shown for simplicity.

The adder module may provide an output coupled to signal 414. Signal 414 may be coupled to a register module including registers 406-408. The register module may be enabled to provide an output coupled to signal 415 based on signal 425. For example, signal 415 may be coupled to decoder engine 315 of FIG. 3 as described above with reference to decoder module 300. Other implementations of the pre-calculator engine 400 may be possible and well know to person skilled in the art.

In an example, the turbo decoder module 300 including the pre-calculator engine 400 may be implemented in a programmable logic device (PLD). A PLD is well known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

For instance, a PLD may include programmable resources, such as adders, that may be used to implement a decoder design according to an embodiment of the present invention. For example, implementing the processor or pre-calculator design 400 may be well suited for such PLD. In another example, a PLD may include a hard intellectual property (IP) core having performance sensitive circuits of a turbo decoder module implemented, e.g., turbo decoder engines 312-315. In such instances, a user may implement a high performance turbo decoder module, such as design 300 of FIG. 3*b*, in a PLD utilizing the hard IP core of a turbo decoder module of the PLD. The high performance parameters of a turbo decoder may include the capability of decoding high speed input data. For example, the decoder design of FIG. 3*b* may process input data rates of 400 Mbits or greater. In other examples, a PLD may include a hard IP core representing the entire function of a turbo decoder module, for example, the turbo decoder module of FIG. 3*b*.

Figure 5:
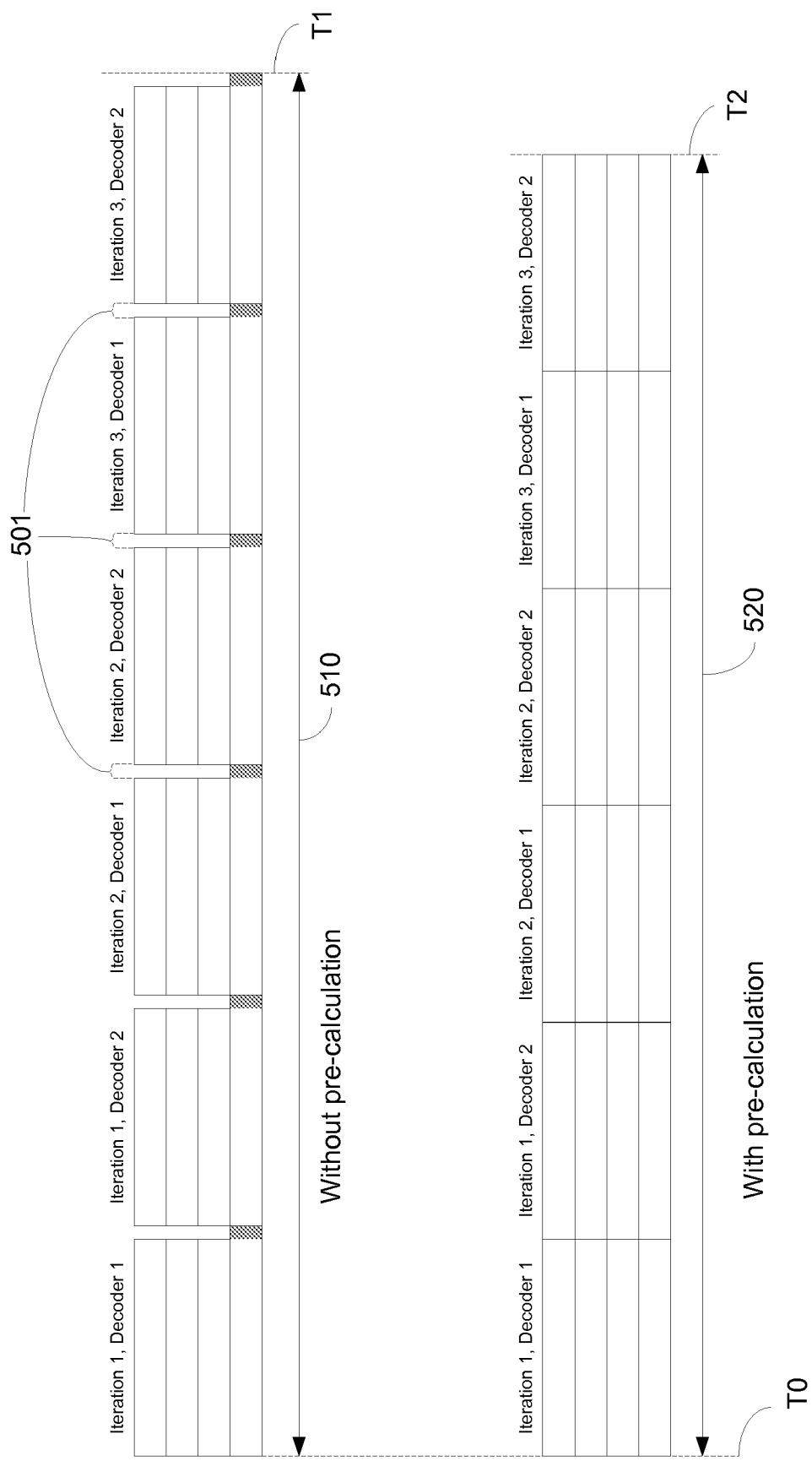
FIG. 5 illustrates a decoded data packet according to an embodiment of the present invention.

FIG. 5 illustrates two decoded data packets, where a first decoded data packet 510 may represent an output of a turbo decoder module without the benefit of a pre-calculation circuit. The other decoded data packet 520 may represent an output of a turbo decoder module including a pre-calculation module according to an embodiment of the present invention. The decoded data packet 520 may represent a decoded output coupled to signal 335 of the turbo decoder module 300.

For example, two turbo decoder modules, e.g., the first decoder is without a pre-calculator circuit while the second decoder includes a pre-calculator circuit, coupled to receive identical encoded data packets including tail bits may have different throughput. The first decoder module may generate the decoded data packet 510 and the second decoder module may generate the decoded data packet 520. If both decoders have the same starting point (e.g., T0), the second decoder module may process the encoded data packet faster than the first decoder. As shown in FIG. 5, the time interval of packet 520 (e.g., T0-T2) is greater than the time interval of packet 510 (e.g., T0-T1). The difference between the two time intervals may be related to a plurality of additional time intervals needed by the first decoder to process or evaluate the tail bits, which is represented by time intervals 501.

In FIG. 5, two decoders are shown to generate two decoded packets, e.g., packets 510 and 520. The two decoders are configured to perform three iterations. Other numbers of iterations are possible and may depend on the design of the turbo decoder module and the desired outcome, e.g., bit error rate. FIG. 5 illustrates that a turbo decoder module without tail bits pre-calculator circuit needs additional time to complete the decoding. Furthermore, the greater number of iterations required, longer time duration may be needed to provide the decoded data packet. Therefore, a turbo decoder design including a processor to pre-calculate tail bits may have enhanced performance and provide a greater throughput. Additionally, the enhanced performance may be extended to various block sizes and number of iterations.

Figure 6:
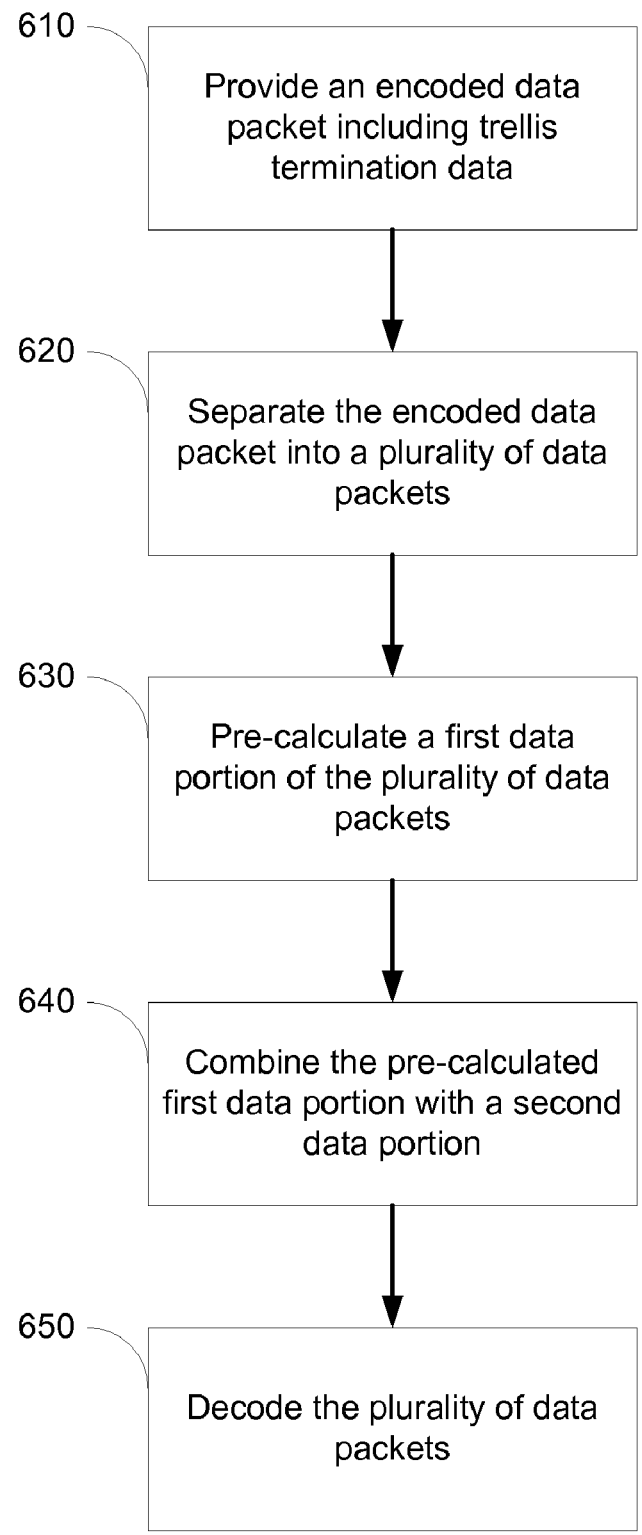
FIG. 6 illustrates a flow diagram of a method of decoding a data packet including trellis termination data according to an embodiment of the present invention.

Turning to FIG. 6, a flow diagram is illustrated for decoding an encoded packet including trellis termination data utilizing a decoder design according to an embodiment of the present invention. At step 610, an encoded data packet or encoded data stream including trellis termination data may be provided. In an example, the encoded data packet of step 610 may be generated by an encoder design, e.g., encoder 100 of FIG. 1. The trellis termination data of the encoded data packet may be provided in accordance with 3GPP LTE protocol. At step 620, the provided encoded data packet of step 610 may be separated or spilt into a plurality of data segments. For instance, if the encoded data packet represents the output of four constituent encoders, then the encoded data packet may be split into five data segments. For example, four out of the five data segments may represent output data of the encoder, e.g., systematic, parity, etc., and the fifth data segment may include the trellis termination data.

At step 630, a first data portion of the plurality of data packets or data segments may be pre-calculated. For instance, the first data portion may be the trellis termination data according to an embodiment of the present invention. In example of the present invention, the first data portion may be pre-calculated while the turbo decoder design is decoding a pervious encoded data packet. Therefore, the turbo decoder design may not need additional time to process the trellis termination data and the throughput of the turbo decoder may be improved. At step 640, the evaluated or pre-calculated trellis termination data (e.g., the first data portion) may be combined with a second data portion or segment of the plurality of data segments. The second data segment may be one of the four data segments representing an output of an encoder, as described above. For example, FIG. 3b illustrates combining a pre-calculated trellis termination data coupled to signal 325 with encoded data output coupled to decoder 315. The pre-calculated trellis termination data, for example, may be concatenated with the encoded output data coupled to decoder 315.

At step 650, the plurality of data packets or segments may be decoded. For example, the turbo decoder described above with reference to FIG. 3b may perform such operation. The four encoded data segments described above may be coupled to the decoders, e.g., decoders 312-315 of the turbo decoder of FIG. 3b. For instance, the turbo decoder 300 may provide decoded data outputs coupled to signals 330-333, where signal 333 may include the pre-calculated trellis termination data information. In another example, the decoded data segments may be combined to provide a decoded data packet. For example, the combiner 318 of FIG. 3b may perform the combing of signals 330-333 (e.g., decoded data segments) to provide the decoded data packet, where signal 335 may represent the decoded data packet.

Further, circuits, e.g., clock circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. For example, although turbo product coding based on either simple parity or extended Hamming constituent codes is described, turbo product coding based on other block codes, such as BCH codes, may also be used, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. A decoder module, comprising:
   a plurality of decoders coupled to receive a first portion of data;
   a processor coupled to receive a second portion of the data; and
   a controller providing a plurality of control signals coupled to the plurality of decoders and the processor, wherein the controller schedules processing of the first portion of the data and the second portion of the data;
   wherein a control signal of the plurality of control signals coupled to the processor configures the processor to perform pre-calculation on the second portion of the data; and
   wherein the second portion of the data is trellis termination data.

2. The decoder module of claim 1, wherein the trellis termination data is parity data of an encoder, and
   wherein the first portion of the data includes systematic data of the encoder.

3. The decoder module of claim 1, wherein the first portion of the data and the second portion of the data are interleaved.

4. The decoder module of claim 1, further comprising a splitter circuit coupled to receive the data and provide a splitter output and the second portion of the data.

5. The decoder module of claim 4, further comprising a memory module coupled to receive the splitter output and provide the first portion of the data.

6. The decoder module of claim 1, wherein an output of the processor is coupled to a decoder of the plurality of the decoders.

7. The decoder module of claim 1, wherein the plurality of decoders processes the first portion of the data in parallel.

8. The decoder module of claim 1, wherein the act of performing pre-calculation on the second portion of the data comprises performing an addition operation, a subtraction operation, or both.

9. The decoder module of claim 1, wherein the processor is configured to perform the pre-calculation on the trellis termination data before decoding the first portion of data.

10. An integrated circuit, comprising:
    a splitter circuit coupled to receive data block and provide a plurality of data packets of the data block;
    a plurality of decoder circuits coupled to receive first data portion of the plurality of data packets;
    a processor circuit coupled to receive second data portion of the plurality of data packets and provide an output coupled to a decoder circuit of the plurality of decoder circuits
    a controller circuit coupled to the processor circuit and the plurality of decoder circuits, wherein the controller circuit is configured to provide control signals and to schedule processing of the first data portion and the second data portion; and wherein the processor circuit is configured to perform pre-calculation on trellis termination data of the second data portion of the plurality of data packets.

11. The integrated circuit of claim 10, wherein the IC further comprises a combiner circuit coupled to receive outputs of the plurality of decoder circuits and provide a decoded message block.

12. The integrated circuit of claim 10, wherein one of the control signals provided by the controller circuit coupled to the processor circuit initiates the performance of pre-calculation on the trellis termination data during a decoding operation of a previous data block.

13. The integrated circuit of claim 10, wherein the plurality of decoder circuits processes the first data portion of the plurality of data packets in parallel.

14. The integrated circuit of claim 10, wherein the act of performing pre-calculation on trellis termination data of the second data portion comprises performing an addition operation, a subtraction operation, or both.

15. The integrated circuit of claim 10, wherein the processor circuit is configured to perform the pre-calculation of the trellis termination data before decoding of the first data portion.

16. A method of decoding data, comprising:
    providing an encoded data packet including trellis termination data;
    separating the encoded data packet into a plurality of data packets;
    performing pre-calculation on a first data portion of the plurality of data packets using a processor;
    combining the pre-calculated first data portion with a second data portion of the plurality of data packets; and
    decoding the plurality of data packets,
    wherein the first data portion is the trellis termination data of the encoded data packet.

17. The method of claim 16, further comprising scheduling the decoding and the pre-calculating, wherein the act of performing pre-calculation on the first data portion occurs during decoding of a previous plurality of data packets.

18. The method of claim 16, wherein the decoding plurality of data packets comprises decoding the plurality of data packets in parallel.

19. The method of claim 16, wherein the combining the pre-calculated first data portion comprises adding the pre-calculated first data portion with the second data portion of the plurality of data packets.

20. The method of claim 16, wherein the act of performing pre-calculation on the first data portion of the plurality of data packets comprises performing an addition operation, a subtraction operation, or both.

* * * * *